(12) United States Patent
Cech et al.

(10) Patent No.: US 6,674,024 B2
(45) Date of Patent: Jan. 6, 2004

(54) SEAT WEIGHT SENSOR

(75) Inventors: Leonard S. Cech, Strongville, OH (US); Michael R. Sewell, Chatham (CA); Edward J. Gillis; Dennis E. Palmer, both of South Lyon, MI (US); James G. Stanley, Novi, MI (US); Vinh H. Tran, West Bloomfield, MI (US); Todd K. Bowman, Canton, MI (US)

(73) Assignee: Automotive Systems Laboratory, INC, Farmington Hills, MI (US)

(*) Notice: Subject to any disclaimer, the term of this patent is extended or adjusted under 35 U.S.C. 154(b) by 0 days.

(21) Appl. No.: 09/930,583

(22) Filed: Aug. 15, 2001

(65) Prior Publication Data

US 2002/0014356 A1 Feb. 7, 2002

Related U.S. Application Data

(63) Continuation of application No. 09/391,064, filed on Sep. 7, 1999, now Pat. No. 6,286,861, which is a continuation of application No. 08/933,701, filed on Sep. 19, 1997, now Pat. No. 5,815,455.
(60) Provisional application No. 60/032,380, filed on Dec. 19, 1996.

(51) Int. Cl.$^7$ .............. G01G 19/52; G01G 5/04; B60R 21/32
(52) U.S. Cl. .............. 177/144; 177/208; 177/254; 280/735; 180/273
(58) Field of Search .............. 177/208, 209, 177/254, 144, 210 R, 136, 211; 280/735; 180/273

(56) References Cited

U.S. PATENT DOCUMENTS

| | | | |
|---|---|---|---|
| 1,232,983 A | 7/1917 | Schenk | 177/254 |
| 1,969,929 A | 8/1934 | Heden | 180/273 |
| 3,372,764 A * | 3/1968 | Crotts | 177/254 |
| 3,752,245 A | 8/1973 | Johnson | 177/208 |
| 3,777,175 A | 12/1973 | Lewis et al. | 307/10 SB |
| 3,874,229 A * | 4/1975 | Ormond | 177/141 |
| 3,889,529 A | 6/1975 | Bradley | 73/141 |
| 3,992,028 A | 11/1976 | Apf et al. | 280/728 |
| 3,992,946 A | 11/1976 | Bradley | 73/407 |
| 4,022,146 A | 5/1977 | Sadler | 115/76 |
| 4,056,156 A | 11/1977 | Dayton | 177/209 |
| 4,085,810 A * | 4/1978 | Wellman | 177/209 |
| 4,184,555 A | 1/1980 | Maltby et al. | 177/208 |
| 4,219,090 A | 8/1980 | Dayton | 177/208 |
| 4,360,071 A | 11/1982 | Dyck | 177/208 |
| 4,361,198 A | 11/1982 | Sjogren | 177/141 |
| 4,383,584 A | 5/1983 | Dyck | 177/208 |
| 4,456,084 A | 6/1984 | Miller | 177/141 |
| 4,644,597 A | 2/1987 | Walker | 5/449 |
| 4,697,656 A | 10/1987 | de Canecaude | 177/144 |
| 4,722,550 A | 2/1988 | Imaoka et al. | 280/727 |
| 4,908,895 A | 3/1990 | Walker | 255/453 |
| 4,957,286 A | 9/1990 | Persons, II et al. | 297/217.2 |
| 4,987,898 A | 1/1991 | Sones | 128/645 |
| 5,052,065 A | 10/1991 | West | 5/424 |
| 5,092,415 A | 3/1992 | Asano | 177/208 |

(List continued on next page.)

Primary Examiner—Randy W. Gibson
(74) Attorney, Agent, or Firm—Dinnin & Dunn, P.C.

(57) ABSTRACT

A hydrostatic weight sensor comprises a bladder of flexible material that contains a fluid, preferably in an amount less than the capacity of the bladder when the bladder is unloaded, the pressure of which is sensed by a pressure sensor so as to provide a measure of weight upon the bladder. The bladder is mountable within a seat below the seat cushion and above the seat base, wherein seating loads are distributed across the bladder by the seat cushion and the seat base. In one embodiment, the bladder comprises a plurality of sheets of flexible material that are sealably connected to one another along a periphery, and are further connected to one another at one or more locations within the periphery so as to create a plurality of fluid containing zones that are in fluid communication with one another.

19 Claims, 3 Drawing Sheets

U.S. PATENT DOCUMENTS

| | | | | |
|---|---|---|---|---|
| 5,117,373 A | 5/1992 | Huff | ............................ | 364/550 |
| 5,129,472 A | 7/1992 | Du et al. | ..................... | 177/208 |
| 5,176,424 A | 1/1993 | Tobita et al. | ............. | 297/284.1 |
| 5,232,243 A | 8/1993 | Blackburn et al. | ........... | 280/732 |
| 5,234,065 A | 8/1993 | Schmidt | ..................... | 177/209 |
| 5,427,331 A | 6/1995 | Stroud | .................. | 244/122 AG |
| 5,430,275 A | 7/1995 | Braunisch | .................... | 219/708 |
| 5,474,327 A | 12/1995 | Schousek | ...................... | 280/735 |
| 5,529,377 A | 6/1996 | Miller | ...................... | 297/284.6 |
| 5,612,876 A | 3/1997 | Zeidler et al. | ......... | 364/424.055 |
| 5,634,685 A | 6/1997 | Herring | .................. | 297/219.11 |
| 5,797,155 A | 8/1998 | Maier et al. | ............ | 297/DIG. 3 |
| 5,848,661 A | 12/1998 | Fu | .............................. | 180/273 |
| 5,864,295 A | 1/1999 | Jarocha | ....................... | 340/667 |
| 5,886,301 A * | 3/1999 | Preble | ......................... | 177/208 |
| D409,935 S | 5/1999 | Speckhart | ................... | D10/104 |
| 5,904,219 A | 5/1999 | Anahid et al. | .............. | 180/273 |
| 5,918,696 A | 7/1999 | VanVoorhies | ................ | 180/273 |
| 5,927,427 A | 7/1999 | Sewell et al. | ................ | 180/273 |
| 5,957,491 A | 9/1999 | Cech et al. | .................. | 280/735 |
| 5,975,568 A | 11/1999 | Speckhart et al. | ........... | 280/735 |
| 5,979,585 A | 11/1999 | VanVoorhies | ................ | 280/735 |
| 5,984,349 A | 11/1999 | VanVoorhies | ................ | 280/735 |
| 5,986,221 A | 11/1999 | Stanley | ........................ | 280/735 |
| 5,987,370 A | 11/1999 | Murphy et al. | ................. | 701/45 |
| 6,021,863 A | 2/2000 | Stanley | ........................ | 180/273 |
| 6,024,378 A | 2/2000 | Fu | .............................. | 280/735 |
| 6,043,736 A | 3/2000 | Sawahata et al. | ............ | 340/438 |
| 6,045,155 A | 4/2000 | Cech et al. | .................. | 280/735 |
| 6,047,423 A | 4/2000 | Larson | .......................... | 5/709 |
| 6,055,473 A | 4/2000 | Zwolinski et al. | ............ | 701/49 |
| 6,056,079 A | 5/2000 | Cech et al. | .................. | 180/273 |
| 6,058,341 A | 5/2000 | Myers et al. | .................. | 701/45 |
| 6,076,853 A | 6/2000 | Stnley | ......................... | 280/735 |
| 6,089,106 A * | 7/2000 | Patel et al. | .................. | 280/735 |
| 6,101,436 A | 8/2000 | Fortune et al. | ................ | 701/45 |
| 6,109,117 A | 8/2000 | Stanley | ........................ | 280/735 |
| 6,138,067 A | 10/2000 | Cobb et al. | .................... | 701/45 |
| 6,180,893 B1 * | 1/2001 | Salgo | ......................... | 177/144 |
| 6,286,861 B1 | 9/2001 | Cech et al. | .................. | 280/735 |

* cited by examiner

SEAT WEIGHT SENSOR

CROSS-REFERENCE TO RELATED APPLICATIONS

The instant application is a continuation of U.S. application Ser. No. 09/391,064 filed on Sep. 7, 1999, now U.S. Pat. No. 6,286,861, which is a continuation of U.S. application Ser. No. 08/933,701 filed on Sep. 19, 1997, now U.S. Pat. No. 5,815,455, claiming benefit of U.S. Provisional Application Ser. No. 60/032,380 filed on Dec. 19, 1996. The above-identified applications are incorporated herein by reference.

TECHNICAL ART

The instant invention generally relates to sensors and systems for measuring weight and more particularly to a weight sensor for measuring the weight of occupants and other objects in a motor vehicle seat such as useful determining occupant seating conditions for controlling a vehicle safety restraint system.

BACKGROUND OF THE INVENTION

A vehicle may contain automatic safety restraint actuators that are activated responsive to a vehicle crash for purposes of mitigating occupant injury. Examples of such restraint actuators include air bags, seat belt pretensioners, and deployable knee bolsters.

One objective of an automatic safety restraint system is to mitigate occupant injury, thereby not causing more injury with the automatic restraint system than would be caused by the crash had the automatic restraint system not been activated. Notwithstanding the protective benefit of these automatic safety restraint actuators, there is generally both a risk and a cost associated with the deployment thereof. Generally, it is desirable to only activate automatic safety restraint actuators when needed to mitigate injury because of the expense of replacing the associated components of the safety restraint system, and because of the potential for such activations to harm occupants. This is particularly true of air bag restraint systems, wherein occupants too close to the air bag at the time of deployment—i.e. out-of-position occupants—are vulnerable to injury or death from the deploying air bag even when the associated vehicle crash is relatively mild. Moreover, occupants who are of small stature or with weak constitution, such as children, small adults or people with frail bones are particularly vulnerable to injury induced by the air bag inflator. Furthermore, infants properly secured in a normally positioned rear facing infant seat (RFIS) in proximity to a front seat passenger-side air bag are also vulnerable to injury or death from the deploying air bag because of the close proximity of the infant seat's rear surface to the air bag inflator module.

Air bag inflators are designed with a given restraint capacity, as for example, the capacity to protect an unbelted normally seated fiftieth percentile occupant when subjected to a 30 MPH barrier equivalent crash, which results in associated energy and power levels which can be injurious to out-of-position occupants. While relatively infrequent, cases of injury or death caused by air bag inflators in crashes for which the occupants would have otherwise survived relatively unharmed have provided the impetus to reduce or eliminate the potential for air bag inflators to injure the occupants which they are intended to protect.

One technique for mitigating injury to occupants by the air bag inflator is to reduce the power and energy levels of the associated air bag inflator, for example by reducing the amount of gas generant in the air bag inflator, or the inflation rate thereof. This reduces the risk of harm to occupants by the air bag inflator while simultaneously reducing the restraint capacity of the air bag inflator, which places occupants a greater risk for injury when exposed to higher severity crashes.

Another technique for mitigating injury to occupants by the air bag inflator is to control the rate of inflation or the capacity of the inflator responsive to a measure of the severity of the crash. However, the risk of injury to such occupants would not be mitigated under the conditions of higher crash severity when the inflator is intentionally made aggressive in order to provide sufficient restraint for normally positioned occupants.

Yet another technique for mitigating injury to occupants by the air bag inflator is to control the activation of the air bag inflator responsive to the presence, position, and size of the occupant, or to the severity of the crash. For example, the air bag inflator can be disabled if the occupant weight is below a given threshold. Moreover, the inflation capacity can be adjusted by controlling the number of inflation stages of a multi-stage inflator that are activated. Furthermore, the inflation power can be adjusted by controlling the time delay between the firings of respective stages of a multi-stage inflator.

One measure of restraint capacity of an air bag inflator is the amount of occupant kinetic energy that can be absorbed by the associated air bag system, whereby when the occupant collides with the gas filled air bag, the kinetic energy of the occupant is converted to potential energy via the pressurization of the air bag, and this potential energy is dissipated by venting pressurized gases from the air bag. As a vehicle in a crash is decelerated, the velocity of an unrestrained occupant relative to the vehicle increases. Preferably, the occupant restraint process is commenced early in the crash event so as to limit the amount of occupant kinetic energy that must be absorbed and thereby minimize the associated restraint forces and accelerations of and loads within the occupant. If the occupant were a simple inertial mass without friction relative to the vehicle, the kinetic energy of the occupant would be given by $\frac{1}{2} M \cdot V^2$, where M is the mass of the occupant and V is the occupant velocity relative to the vehicle. If a real occupant were represented by an interconnected set of bodies, some of which have friction relative to the vehicle, each body of which may have differing velocities relative the vehicle, the above equation would apply to the motion of the center of gravity of the occupant. Regardless of the representation, occupants of larger mass will have a larger kinetic energy for the same velocity relative to the vehicle. Therefore, an occupant weight sensor is useful in an air bag system with variable restraint capacity to enable the restraint capacity to be preferentially adapted to the weight, or mass, of the occupant.

Except for some cases of oblique or side-impact crashes, it is generally desirable to not activate an automatic safety restraint actuator if an associated occupant is not present because of the otherwise unnecessary costs and inconveniences associated with the replacement of a deployed air bag inflation system. Occupant presence can be detected by a seat weight sensor adapted to provide either a continuous measure of occupant weight or to provide a binary indication if the occupant weight is either above or below a specified weight threshold.

Known seat weight sensors comprise one or more pads employing force sensitive resistive (FSR) films. These arrangements are typically used as weight threshold systems to disable a passenger air bag when the seat is empty. Load cells attached to the seat mounting posts have also been used in research applications. Mechanisms that use string based potentiometers to measure downward seat displacement have also been investigated.

Such known arrangements suffer from several drawbacks. First, variable resistance force sensors have limited sensitivity and in some situations are not sensitive enough to put directly under a seat pad while still achieving the desired response. Second, the threshold weight system provides only very limited information. For example, such arrangements provide no indication as to the size of an occupant. Third, the resistance values of known variable force resistor change with temperature, and are subject to drift over time with a constant load on the sensor.

Furthermore, other known sensing arrangements do not otherwise provide suitable results. For example, the use of load cells is prohibitively expensive for large-scale commercial applications. Strain gauges of any type may be impractical because of the difficulty in applying them to the strained material. Finally, mechanical string potentiometer based weight sensors are complex, and subject to failure from stretching of the string.

The prior art also teaches the use of seat weight sensors outside the automotive environment, for example as a means for disabling the activation of either a boat or an industrial machine if the operator is not properly seated, or for weighing a person seated on an exercise bike. These devices employ pneumatic bladders located in the seat, whereby the pressure within the bladder is used to either activate a threshold switch or to provide a continuous indication of occupant weight.

One problem with prior art pneumatic sensors, particularly when applied to the automotive environment, is their sensitivity to environmental conditions, particularly to ambient temperature and pressure. A seat weight sensor in an automotive environment must function reliably and accurately over a wide range of temperatures and pressures which can cause significant errors.

The prior art also teaches the use of hydraulic load cells, wherein the weight to be measured acts upon a piston element of known area, whereby the measured weight is found by multiplying a measured pressure times the known area. One problem with hydraulic load cells in the automotive environment, particularly in a seat, is that the effects of load cell orientation on hydraulic head can introduce load measurement errors.

SUMMARY OF THE INVENTION

The instant invention overcomes the above-noted problems by providing a seat weight sensor which incorporates a fluid containing bladder placed in series with the load path in the seat, whereby a load applied to and distributed across the bladder increases the pressure of the fluid therein. The pressure of the fluid is measured by a pressure sensor and is substantially proportional to the magnitude of the applied load, and substantially inversely proportional to the supported area of the bladder. The instant invention also incorporates a means for distributing the applied load across the area of the fluid containing bladder so as to prevent a concentrated load from compressing the top and bottom surfaces of the bladder against one another and thereby creating an alternate load path which does not cause an associated pressurization of the fluid. The output signal is substantially linear with respect to weight provided that 1) the weight is distributed over a sufficient area so that the bladder does not bottom out, 2) the height of the bladder is sufficiently small relative to the base dimensions so that the effect of loading on the support area is relatively small. Preferably, the amount of fluid in the bladder should be less than the capacity of the bladder when the bladder is unloaded. Otherwise, the fluid in the bladder can be pressurized by increasing temperature or decreasing ambient pressure which results in associated load measurement errors.

The bladder may incorporate either a liquid or a gas as the sensing fluid. A gaseous sensing fluid is prone to expansion and contraction resulting from changes in ambient temperature and pressure relative to the conditions under which the bladder was initially filled. A gaseous fluid is also more prone to leakage and to localized collapse of the top and bottom surfaces of the bladder under the influence of a concentrated load. When located in the seat under a cushion, the cushion can provide an effective distribution of the loads applied to the seat. A sheet of semi-rigid material can also be used to distribute load to the bladder, particularly the reaction forces from the seat springs if the bladder is located thereon.

The bladder may incorporate internal seams which secure the top and bottom surfaces of the bladder to one another within the periphery of the bladder without disrupting the fluid communication within the bladder. These seams prevent the bladder from bulging in the center when the fluid expands due to temperature or pressure effects. Such bulging is detrimental to seating comfort. The seams also assist reducing the overall thickness of the bladder and in conserving the necessary amount of sensing fluid, which reduces cost when liquids such as silicone based fluids are used. The internal seams are also effective for modifying the sensitivity of the bladder. For example, a bladder may be more sensitive to central loads than to distal loads as might result when a portion of the applied load is carried by a portion of the seat cushion which is not in series with the load bladder load path. In this case, selective zones within the bladder, for example near the center, may be isolated from the sensing fluid by a closed path seam such that a load applied thereto is not sensed by the fluid within the bladder.

The bladder may be constructed from several sheets of fabric, such as nylon, coated with a sealably weldable coating, such as polyurethane which can be RF (radio frequency) welded. A coating can be applied to the outside of the bladder to increase the membrane stiffness thereof and thereby facilitate the distribution of applied loads.

The instant invention integrates pressure over the entire loading area of the seat, thereby producing a consistent output signal that is relatively insensitive to the associated load distribution. The instant invention is relatively flexible, and when installed under the seat cushion does not interfere with seating comfort. Furthermore, this installation is relatively easy, thereby minimizing the impact on the overall manufacturing process of the seat/vehicle.

Accordingly, one object of the instant invention is to provide an improved seat weight sensor which provides a consistent and accurate measure of the seat loading independent of the location of the source of weight on the seat.

A further object of the instant invention is to provide an improved seat weight sensor which provides a consistent and accurate measure of the seat loading independent of the size and distribution of the source of weight on the seat.

A yet further object of the instant invention is to provide an improved seat weight sensor which provides a consistent and accurate measure of the seat loading independent of the amount of weight on the seat.

A yet further object of the instant invention is to provide an improved seat weight sensor which operates under a wide range of ambient temperature and pressure conditions.

A yet further object of the instant invention is to provide an improved seat weight sensor which can distinguish between a rear facing infant seat, for which an air bag system is preferably not deployed, and other occupants for which an air bag system is preferably deployed in the event of a crash of sufficient severity.

A yet further object of the instant invention is to provide an improved seat weight sensor which can be incorporated into an intelligent safety restraint system for which the preferable mode of the activation of a controllable occupant restraint system is dependent upon the weight of the occupant.

A yet further object of the instant invention is to provide an improved seat weight sensor which does not interfere with occupant comfort.

A yet further object of the instant invention is to provide an improved seat weight sensor which is insensitive to the orientation of the seat.

A yet further object of the instant invention is to provide an improved seat weight sensor which is inexpensive to produce.

In accordance with these objectives, one feature of the instant invention is a fluid containing bladder mounted in the base of the seat.

Another feature of the instant invention is a pressure sensor operatively coupled to the fluid containing bladder for measuring the pressure therein.

Yet another feature of the instant invention is a differential pressure sensor operatively coupled to the fluid containing bladder for measuring the pressure therein relative to local atmospheric pressure.

Yet another feature of the instant invention is the incorporation of a gas as the fluid in the fluid containing bladder.

Yet another feature of the instant invention is the incorporation of a liquid as the fluid in the fluid containing bladder.

Yet another feature of the instant invention is the incorporation of a means for distributing load across the load bearing surface of the bladder.

Yet another feature of the instant invention is that the volume of fluid in the fluid containing bladder is such that the volume of the bladder in an unloaded state is less than the maximum volume of the bladder over the range of environmental operating conditions.

The specific features of the instant invention provide a number of associated advantages. One advantage of the instant invention with respect to the prior art is that the fluid containing bladder is responsive to loads over a large area of the seat without regards to the distribution or amount of loading.

Another advantage of the instant invention is that the output signal is inherently relatively linear which simplifies signal analysis.

Yet another advantage of the instant invention is that the seat weight sensor thereof can enable a rear facing infant seat for which the air bag system is preferably not deployed to be distinguished from an occupant for which the air bag system is preferably deployed.

Yet another advantage of the instant invention is that the seat weight sensor thereof is sufficiently robust, reliable and accurate to enable associated occupant weight dependent control of a controllable occupant restraint system.

Yet another advantage of the instant invention is that the seat weight sensor thereof is relatively inexpensive to produce.

Accordingly, the instant invention provides an improved seat weight sensor which is relatively insensitive to the effects of ambient temperature and pressure; which is simple in construction and relatively robust and reliable in operation; which can be readily incorporated into an automotive seat without interfering with occupant comfort; and which can be produced relatively inexpensively.

The instant invention will be more fully understood after reading the following detailed description of the preferred embodiment with reference to the accompanying drawings. While this description will illustrate the application of the instant invention in an automotive safety restraint system, it will be understood by one with ordinary skill in the art that the instant invention can also be applied to other systems for weighing objects.

DETAILED DESCRIPTION OF THE PREFERRED EMBODIMENT(S)

Figure 5:
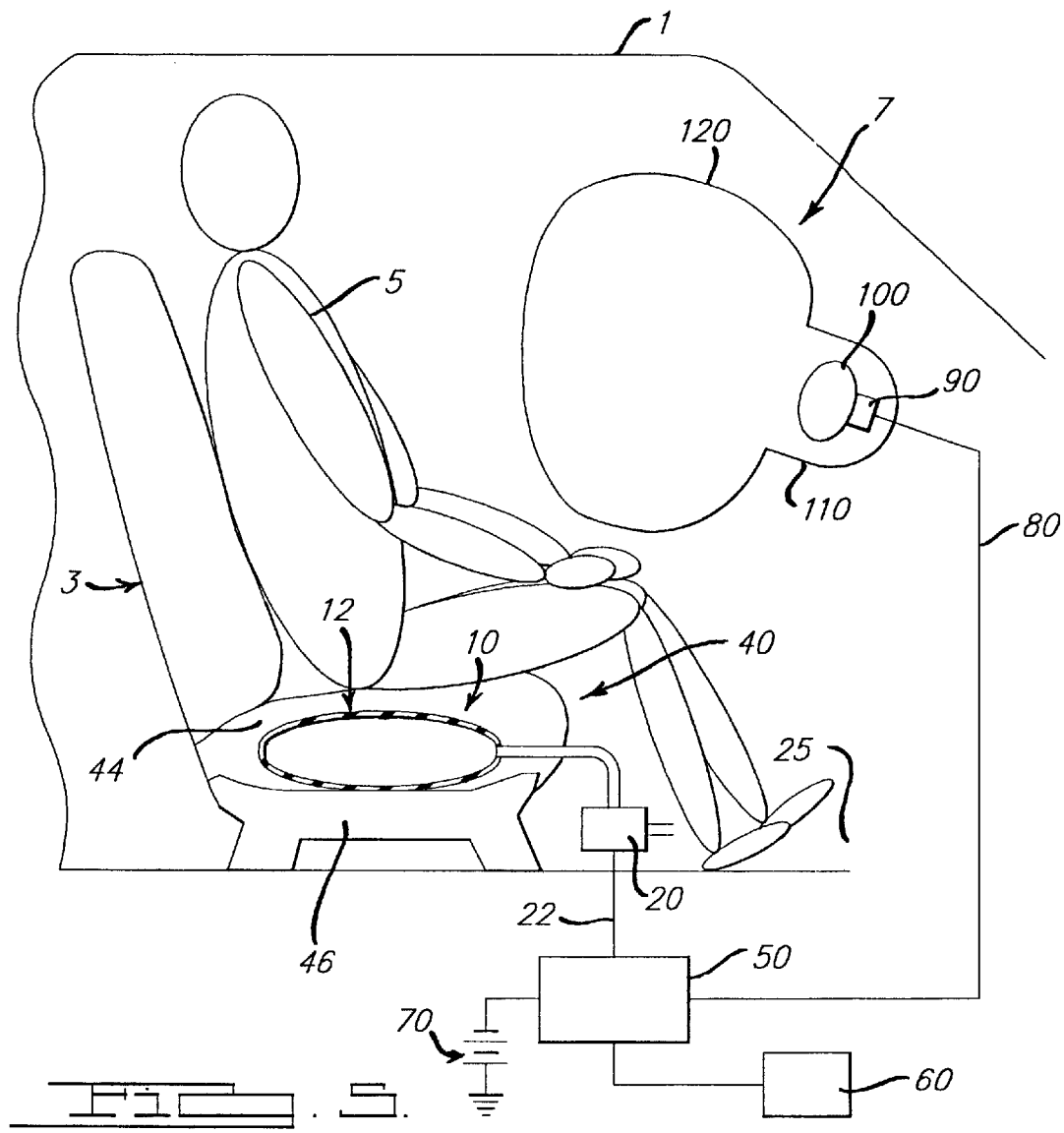
FIG. 5 illustrates one environment of the instant invention.

Referring to FIG. 5, a seat 3 in a motor vehicle 1 incorporates a hydrostatic seat weight sensor 10 mounted in the seat base 40. The hydrostatic seat weight sensor 10 comprises bladder 12 and a differential pressure sensor 20 for measuring the difference in pressure between the bladder 12 and the atmosphere 25. The bladder 12 is sandwiched between the seat frame 46 below and the seat cushion foam 44 above. The bladder is filled with a fluid, either gaseous or liquid (including gels).

In operation, an occupant 5 seated on the base 40 of seat 3 causes the pressure inside a bladder 12 to increase such that product of the differential pressure, as sensed by differential pressure sensor 20, multiplied times the area of the base of the bladder 12 is substantially equal to the total weight distributed by the seat cushion foam 44 over the top of the bladder 12. The pressure signal output 22 from differential pressure sensor 20 is operatively coupled to an electronic control module 50 which converts the pressure signal output 22 to a measure of occupant weight using known analog, digital, or microprocessor circuitry and software. A crash sensor 60 is also operatively coupled to the electronic control module 50. Responsive to a crash detected by the crash sensor 60, and further responsive to the sensed weight of the occupant as transformed from the pressure signal output 22, the electronic control module 50 generates a signal 80 which is operatively coupled to one or more. initiators 90 of one or more gas generators 100 mounted in an air bag inflator module 110, thereby controlling the activation of the air bag inflator module assembly 7 so as to inflate the air bag 120 as necessary to protect the occupant 5 from injury which might otherwise be caused by the crash. The electrical power necessary to carry out these operations is provided by a source of power 70, preferably the vehicle battery.

Figure 1:
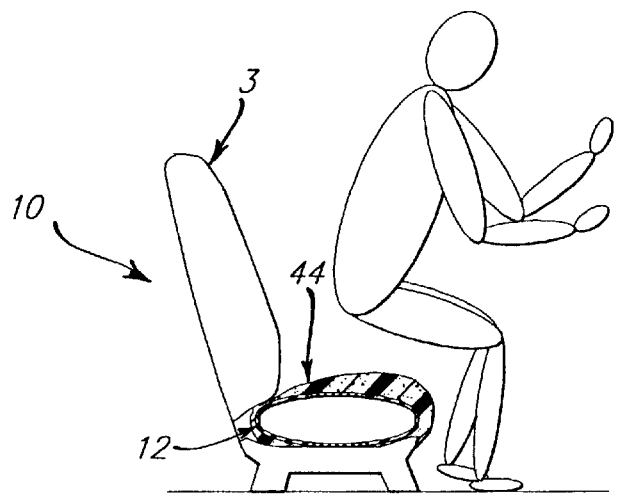
FIG. 1 illustrates the incorporation of the instant invention in a vehicle seat.

Referring to FIG. 1, the seat cushion 44 acts to distribute the load from the occupant 5 across the top load bearing surface of the bladder 12, thereby causing an increase in pressure of the fluid within the bladder 12 thereby supporting the top load bearing surface of the bladder 12. By distributing the load across the top load bearing surface, the seat cushion acts to prevent concentrated loads applied to the seat from causing the top and bottom surfaces of the bladder 12 from collapsing against one another, thereby creating an alternate path for load which would not cause an associated increase in pressure of the fluid.

Figure 2:
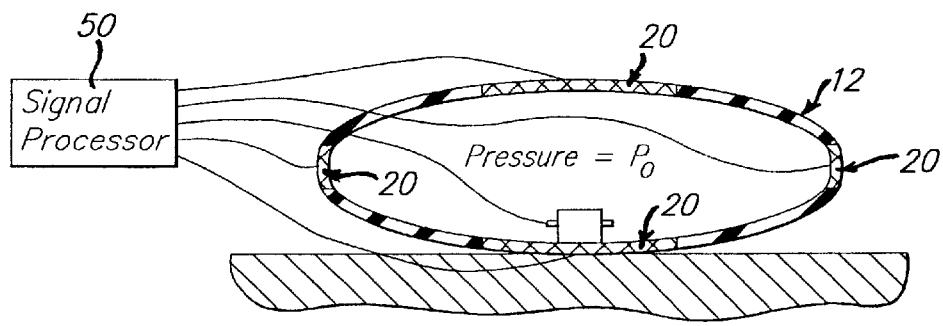
FIG. 2 illustrates the bladder of one embodiment of the instant invention in an unloaded condition together with several alternate pressure sensors connected to an associated signal processor which determines weight from measured pressure.

Referring to FIG. 2, the pressure of the unloaded bladder 12 is given by $P_o$, which is substantially equal to the local atmospheric pressure. The pressure in the bladder 12 may be alternately sensed by an absolute pressure sensor 20, or by one or more strain sensors 20 incorporated in or attached to the surface of the bladder 12. The signal from the pressure sensor 20 is operatively coupled to a signal processor 50 which measures the weight W of the applied load therefrom.

Figure 3:
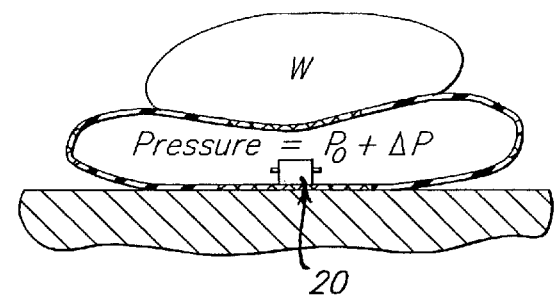
FIG. 3 illustrates the instant invention responsive to one possible load distribution.
Figure 4:
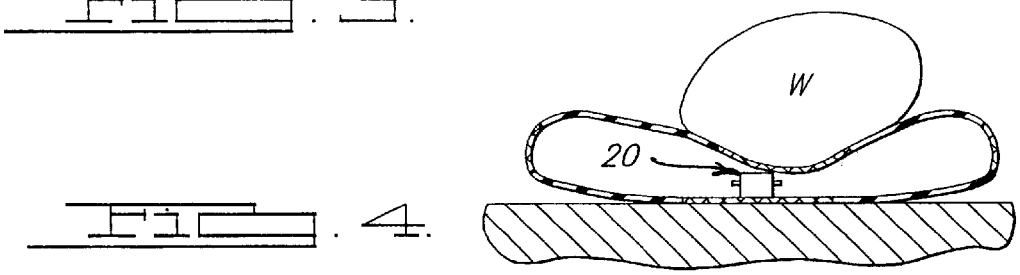
FIG. 4 illustrates the instant invention responsive to a second possible load distribution.

Referring to FIG. 3, a load of weight W supported by the bladder 12 causes the pressure of the fluid therein to increase by an amount ΔP, such that the weight W is given by $$W = \Delta P \cdot A \tag{1}$$

where A is the effective area of the bottom load bearing surface of the bladder 12. If the bladder 12 is fully supported by the seat base 46, then the effective area A is substantially the same as the area of the base of the bladder 12. This is true regardless of the area and distribution of loading on the top load bearing surface of the bladder 12 as is illustrated in FIG. 4, so long as the loading on the top load bearing surface of the bladder 12 is sufficiently distributed so that the top surface and bottom surfaces of the bladder 12 are not collapsed upon one another within the periphery of the bladder 12.

Note that the area A of the bladder which rests upon the supporting surface remains approximately equal regardless of the distribution of the weight which is applied to the bladder 12. In other words two different objects each with weight, W, but with different distributions of weight—one concentrated and one whose weight is more spread out—will each register the same increase in pressure, ΔP. Two equal weights, each with weight W, both register the same increase in pressure. The pressure increase ΔP resulting from an applied weight is independent of the shape of the applied weight, W, as long as the contact area between the bottom of the bladder 12 and the supporting surface remains constant.

The bladder 12 is preferably only partially filled with fluid with an amount such that relatively high ambient temperatures or relatively low ambient pressures do not cause the fluid of the unloaded bladder 12 within the seat to become pressurized relative to local atmospheric pressure. For the bladder 12 mounted within a seat 3 as illustrated in FIG. 1, with no applied load, the pressure of the fluid within the bladder 12 will generally be higher than the local atmospheric pressure by an amount corresponding to the weight of the top surface of the bladder 12 and to the hydrostatic pressure of the fluid within the bladder 12 relative to the location of the pressure sensor 20. Typically, these incremental components of pressure are negligible relative to the range of loads to be measured.

The bladder 12 is preferably designed so that the contact area at the bottom load bearing surface of the bladder 12 remains relatively constant over 1) the expected range of applied weights, W, and weight distributions which may result from various sizes and positions of objects, and 2) the expected range of ambient temperature and pressure conditions.

For situations where it is not possible to design the bladder 12 so as to prevent significant variation in the contact area at the bottom load bearing surface of the bladder 12, then the differential pressure of the fluid within the bladder 12 may not by itself accurately indicate the applied weight. A significant variation in the contact area will result in an ambiguity between the increase in fluid pressure relative to the increase in internal tension along the surface of the bladder. In this case, piezoresistive film can be added to the surface of the bladder in order to measure surface tension. At the upper surface of the bladder, the weight, W, is supported by an increase in pressure, dP, as well as an increase in the surface tension of the bladder 12. When surface tension is known, this information can be used to resolve the pressure/tension ambiguity and then accurately estimate the weight W of the applied load.

Figure 6:
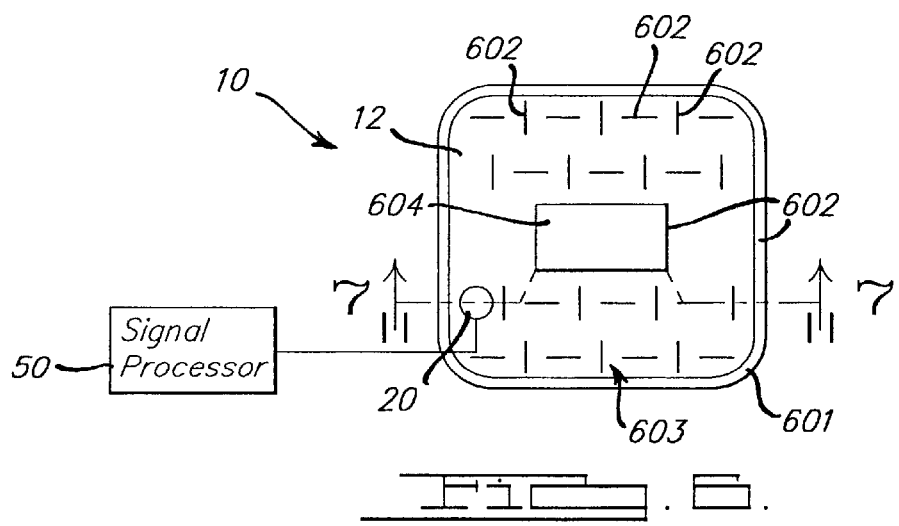
FIG. 6 illustrates a second embodiment of the instant invention constructed from sealably interconnected sheets of flexible material.
Figure 7:
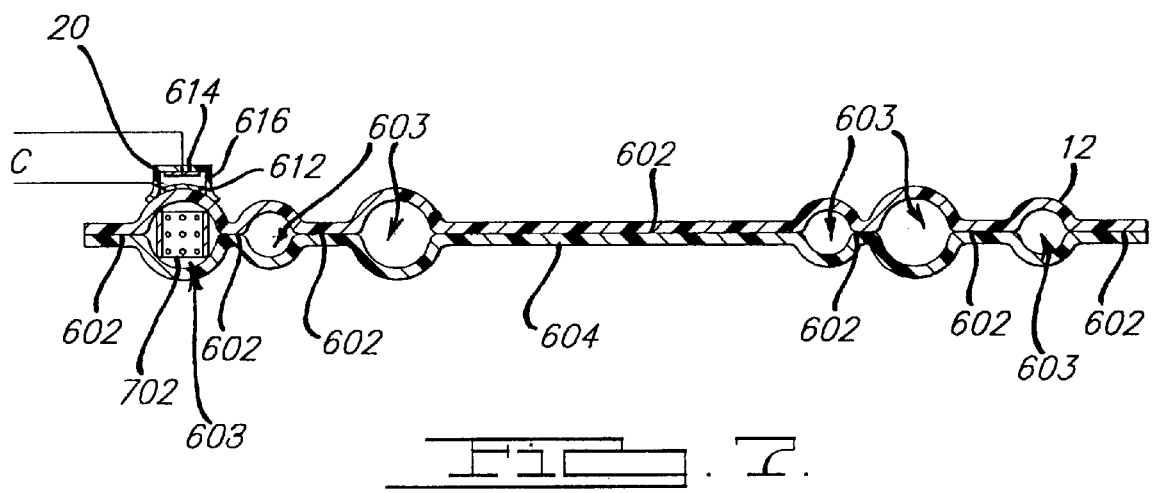
FIG. 7 illustrates a cross section of the FIG. 6 embodiment illustrating several fluid containing zones within the associated bladder, and also illustrating an associated dead-zone.

Referring to FIGS. 6 and 7, the bladder 12 of a hydrostatic seat weight sensor 10 is constructed from two sheets of a flexible material which is coated with a material which can be sealably welded. The sheets of flexible material are first placed with sealably weldable coating sides adjacent one another, and are sealed to one another by a welded seam 602 along a periphery 601 so as to form an inflatable confinement. The sheets of material are also welded to one another at a plurality of seams 602 at locations 603 within the periphery 601 so as to form a plurality of zones in fluid communication with one another within the inflatable confinement. The bladder 12 is partially filled with a fluid which is distributed amongst the various zones. The amount of fluid and number of zones is such that the top and bottom surfaces of the bladder 12 do not collapse against one another responsive to an applied load. The pressure within the bladder 12 is sensed by a pressure sensor 20 attached to the outside surface of the bladder 12, whereby a change of pressure within the bladder applies a force to a first electrode 612 of the pressure sensor 20 causing this electrode to deform or move relative to a second electrode 614, thereby changing the capacitance between the electrodes 612 and 614. The second electrode is secured to the pressure sensor housing 616 which is attached to the surface of the bladder. A restraint 702 is located on the inside of the bladder 12 proximate the pressure sensor so as to prevent the top and bottom surfaces of the bladder 12 from collapsing against one another proximate the pressure sensor 20.

One problem which can occur with a hydrostatic seat weight sensor 10 is reduced sensitivity to loads which are distributed in the seat towards the periphery of the bladder. This problem can be mitigated by providing a non-uniform distribution of fluid containing zones 603 within the periphery of the bladder. Furthermore, one or more dead zones 604 may be formed within the bladder, each by a seam 602 which defines a closed path, whereby the portion of load applied to the seat cushion 44 in the region of the dead zone 604 is either supported by the adjacent fluid containing zones, or is transferred to the seat base 46 without increasing the pressure of the fluid within the bladder 12.

In an exemplary system in accordance with FIGS. 6 and 7, the top surface of the bladder 12 is constructed from 200 denier nylon fabric which is coated with polyurethane, and the bottom surface of the bladder 12 is constructed from 840 denier nylon fabric which is also coated with polyurethane. The seams are formed by welding the polyurethane coatings of the separate sheets together using an RF welding process. The outside of the bottom surface is also coated with polyurethane so as to distribute localized loads across the bottom surface of the bladder 12. The bladder 12 is filled with a silicone fluid.

Figure 8:
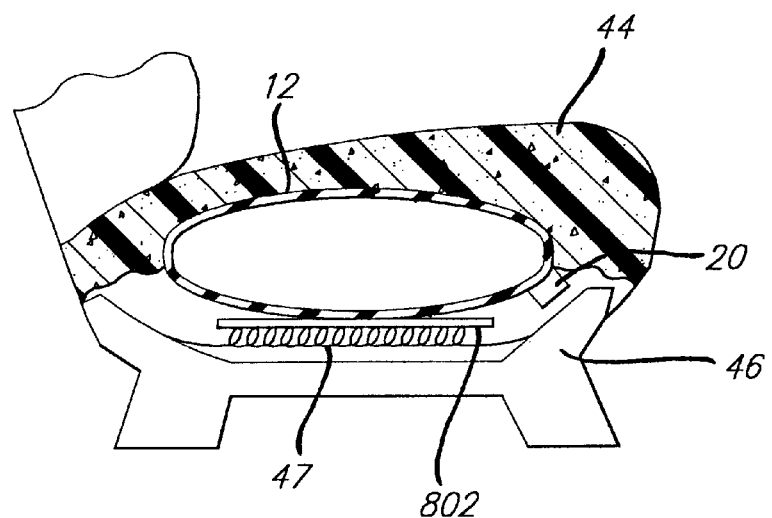
FIG. 8 illustrates a means for distributing the support load from seat springs across the base of the fluid containing bladder of the instant invention.

Referring to FIG. 8, a load distributor 802 constructed comprising sheet of semi-rigid material can be interposed between the bottom surface of the bladder 12 and the top of the seat suspension springs 47 so as to distribute the support loads from the seat base 46 across the bottom load bearing surface of the bladder 12 thereby preventing the top and bottom surfaces of the bladder 12 from collapsing against one another proximate the springs 47.

A gaseous fluid may also be incorporated into the bladder 12. The gas-filled bladder 12 is preferably only partially filled to allow for gaseous expansion due to variations in ambient temperature and pressure, such that over the possible range of environmental operating conditions the volume of the unloaded gas-filled bladder 12 generally does not exceed the design capacity thereof. Moreover, under these conditions, the associated absolute pressure in the bladder would not exceed ambient pressure by more than the negligibly small amount necessary to support the top surface of the bladder 12.

Under the action of a distributed load, the volume of the bladder 12 decreases until the pressure therein is sufficiently great to support the load. For a bladder 12 having a design shape of a rectangular slab having a height and two base dimensions, as the height decreases under the action of the load, the base dimensions increase, thereby increasing the base area of the bladder 12. The weight of the distributed load is then given by the product of the base area of the bladder times the difference in pressure inside and outside the bladder. Even if the loading on the top of the seat is relatively localized, the associated weight is given by the differential pressure acting on the base area of the bladder, assuming the base of the bladder is fully supported and that that top surface of the bladder is not locally compressed against the bottom surface.

For a bladder 12 with a square profile, having a height h and a base dimension S, the effects of load on the support area A of the bladder, and upon the associated differential pressure DP, relative to atmospheric pressure Patm, are illustrated in the following analytic approximation:

From the ideal gas law, with P=absolute fluid pressure within the bladder, V=bladder volume, n=number of moles of gas, R=universal gas constant, and Tatm the temperature of gas within the bladder, $$P \cdot V = n \cdot R \cdot Tatm \quad (2)$$

The pressure within the bladder is given by, $$P = Patm + DP \quad (3)$$

Assuming the bladder is filled to a volume Vfill at a temperature Tfill, the associated pressure Pfill is given from the ideal gas law as, $$Pfill = \frac{n \cdot R \cdot Tfil}{Vfill} \quad (4)$$

The fill volume may also be expressed in terms of the design height h0 and base dimension S0 of the bladder, and the fraction of the design volume Vmax which is filled, $$Vmax = S0^2 \cdot h0 \quad (5)$$

$$Vfill = \alpha \cdot Vmax \quad (6)$$

The volume of the bladder, Vdpc, is then given in terms of the fill conditions, the local atmospheric condtions, and the measured pressure differential DP as, $$Vdpc = Vfill \left(\frac{Tatm}{Tfill}\right) \cdot \frac{Pfill}{Patm + DP} \quad (7)$$

In this analysis, the surface area "a" of the bladder is assumed to remain constant under loading, whereby under the influence of an applied load, the base area increases as the height decreases. This surface area is given by, $$a = 2 \cdot (S^2 + 2 \cdot S \cdot h) \quad (8)$$

Solving for the base dimension S in terms of the height h and surface area "a" gives $$S = -h + \frac{1}{2} \cdot \sqrt{2} \cdot \sqrt{2 \cdot h^2 + a} \quad (9)$$

The base area A and volume V of the bladder are then given by, $$A = s^2 \quad (10)$$

$$A = \left(-h + \frac{1}{2} \cdot \sqrt{2} \cdot \sqrt{2 \cdot h^2 + a}\right)^2 \quad (11)$$

$$V = A \cdot h \quad (12)$$

$$V = \left(-h + \sqrt{h^2 + \frac{a}{2}}\right)^2 \cdot h \quad (13)$$

By equating equations (7) and (13) and solving for the bladder height, assuming that $$a >> 2 \cdot h^2 \quad (14)$$

the height of the bladder in terms of the surface area, fill conditions, ambient conditions, and measureed pressure differential are then given by:

$$h = \frac{1}{2} \cdot \left(\sqrt{\frac{a}{2}} - \sqrt{-\frac{a}{2} + \sqrt{a^2 - 8 \cdot Vdpc \cdot \sqrt{2 \cdot a}}}\right) \quad (15)$$

The measured pressure differential is related to the magnitude of the applied load and bladder surface area by, $$W = \frac{DP}{A} \tag{16}$$

The above equations may be solved implicitly to determine the sensitivity of the weight measurement error to the geometry of the bladder, the fill conditions, and the ambient conditions.

Generally, the sensitivity of the gas filled bladder to ambient temperature and pressure is decreased with decreasing amounts of gas in the bladder, and with decreasing bladder thickness (i.e. height) for the same base dimensions of the bladder. However, as the bladder is made thinner in overall height, and the amount of gas is reduced, the bladder becomes more susceptible to bottoming-out under the influence of localized loads applied to the seat.

One of ordinary skill in the art will appreciate that while the bladder of the instant invention is illustrated herein using a rectangular shape, the particular shape of the bladder is not considered to be limiting to the instant invention.

While specific embodiments have been described in detail, those with ordinary skill in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

We claim:

1. A system for measuring the weight of an occupant in a vehicle seat and for controlling a safety restraint system responsive thereto, comprising:
   a. a bladder mounted beneath the cushion of the seat and supported by the base of the seat, whereby said bladder is constructed from a flexible material;
   b. a fluid contained by said bladder, whereby for substantially no external load applied to said fluid filled bladder the volume of said fluid in said fluid filled bladder is less that the capacity of said fluid filled bladder;
   c. a pressure sensor operably coupled to said bladder for generating a signal responsive to the pressure of said fluid within said bladder; and
   d. a signal processor for measuring the weight of the occupant from said signal for generating a control signal for controlling the safety restraint system responsive to said weight measurement.

2. A system for measuring the weight of an occupant in a vehicle seat and for controlling a safety restraint system responsive thereto as recited in claim 1, whereby said fluid is a gas.

3. A system for measuring the weight of an occupant in a vehicle seat and for controlling a safety restraint system responsive thereto as recited in claim 1, wherein said pressure sensor is responsive to the absolute pressure of said fluid within said fluid filled bladder.

4. A system for measuring the weight of an occupant in a vehicle seat and for controlling a safety restraint system responsive thereto as recited in claim 1, wherein said pressure sensor is responsive to the differential pressure of said fluid within said fluid filled bladder relative to local atmospheric pressure.

5. A system for measuring the weight of an occupant in a vehicle seat and for controlling a safety restraint system responsive thereto, comprising:
   a. a bladder mounted beneath the cushion of the seat and supported by the base of the seat, whereby said bladder is constructed from a flexible material, wherein said bladder further comprises a plurality of sheets of coated fabric sealably connected to one another at a periphery so as to form an inflatable confinement within said periphery whereby said sheets of coated fabric are further connected to one another at one or more locations within said periphery so as to create a plurality of fluid containing zones within said inflatable confinement which are in fluid communication with one another;
   b. a fluid contained by said bladder;
   c. a pressure sensor operably coupled to said bladder for generating a signal responsive to the pressure of said fluid within said bladder; and
   d. a signal processor for measuring the weight of the occupant from said signal for generating a control signal for controlling the safety restraint system responsive to said weight measurement.

6. A system for measuring the weight of an occupant in a vehicle seat and for controlling a safety restraint system responsive thereto as recited in claim 5, wherein said fluid containing zones are non-uniformly distributed within said periphery.

7. A system for measuring the weight of an occupant in a vehicle seat and for controlling a safety restraint system responsive thereto as recited in claim 6, wherein said sheets of coated fabric are further connected to one another along one or more closed paths within said periphery.

8. A system for measuring the weight of an occupant in a vehicle seat and for controlling a safety restraint system responsive thereto as recited in claim 5, further comprising a coating on the outside of at least one load bearing surface of said fluid filled bladder, whereby for substantially no external load applied to said fluid filled bladder the volume of said fluid in said fluid filled bladder is less that the capacity of said fluid filled bladder, wherein said pressure sensor is responsive to the differential pressure of said fluid within said fluid filled bladder relative to local atmospheric pressure, wherein said pressure sensor is isolated from said fluid by the surface of said fluid filled bladder, further comprising a restraint located on the inside of said fluid filled bladder proximate said pressure sensor, whereby said restraint prevents said fluid filled bladder from collapsing proximate said pressure sensor.

9. A system for measuring the weight of an occupant in a vehicle seat and for controlling a safety restraint system responsive thereto as recited in claim 8, wherein said fluid containing zones are non-uniformly distributed within said periphery.

10. A system for measuring the weight of an occupant in a vehicle seat and for controlling a safety restraint system responsive thereto as recited in claim 9, wherein said sheets of coated fabric are further connected to one another along one or more closed paths within said periphery.

11. A system for measuring the weight of an occupant in a vehicle seat and for controlling a safety restraint system responsive thereto as recited in claim 8, wherein said sheets of coated fabric are further connected to one another along one or more closed paths within said periphery.

12. A system for measuring the weight of an occupant in a vehicle seat and for controlling a safety restraint system responsive thereto, comprising:
   a. a bladder mounted beneath the cushion of the seat and supported by the base of the seat, whereby said bladder is constructed from a flexible material;
   b. a sheet of semi-rigid material proximate a load bearing surface of said bladder;

c. a fluid contained by said bladder;

d. a pressure sensor operably coupled to said bladder for generating a signal responsive to the pressure of said fluid within said bladder; and e. a signal processor for measuring the weight of the occupant from said signal for generating a control signal for controlling the safety restraint system responsive to said weight measurement.

13. A system for measuring the weight of an occupant in a vehicle seat and for controlling a safety restraint system responsive thereto, comprising:

a. a bladder mounted beneath the cushion of the seat and supported by the base of the seat, whereby said bladder is constructed from a flexible material;

b. a coating on the outside of at least one load bearing surface of said fluid filled bladder;

c. a fluid contained by said bladder;

d. a pressure sensor operably coupled to said bladder for generating a signal responsive to the pressure of said fluid within said bladder; and e. a signal processor for measuring the weight of the occupant from said signal for generating a control signal for controlling the safety restraint system responsive to said weight measurement.

14. A system for measuring the weight of an occupant in a vehicle seat and for controlling a safety restraint system responsive thereto, comprising:

a. a bladder mounted beneath the cushion of the seat and supported by the base of the seat, whereby said bladder is constructed from a flexible material;

b. a fluid contained by said bladder, whereby said fluid is a liquid;

c. a pressure sensor operably coupled to said bladder for generating a signal responsive to the pressure of said fluid within said bladder; and d. a signal processor for measuring the weight of the occupant from said signal for generating a control signal for controlling the safety restraint system responsive to said weight measurement.

15. A system for measuring the weight of an occupant in a vehicle seat and for controlling a safety restraint system responsive thereto as recited in claim 14, whereby said fluid is a silicone based fluid.

16. A system for measuring the weight of an occupant in a vehicle seat and for controlling a safety restraint system responsive thereto, comprising:

a. a bladder mounted beneath the cushion of the seat and supported by the base of the seat, whereby said bladder is constructed from a flexible material;

b. a fluid contained by said bladder;

c. a pressure sensor operably coupled to said bladder for generating a signal responsive to the pressure of said fluid within said bladder, wherein said pressure sensor is responsive to the strain in the surface of said bladder; and d. a signal processor for measuring the weight of the occupant from said signal for generating a control signal for controlling the safety restraint system responsive to said weight measurement.

17. A system for measuring the weight of an occupant in a vehicle seat and for controlling a safety restraint system responsive thereto, comprising:

a. a bladder mounted beneath the cushion of the seat and supported by the base of the seat, whereby said bladder is constructed from a flexible material;

b. a fluid contained by said bladder;

c. a pressure sensor operably coupled to said bladder for generating a signal responsive to the pressure of said fluid within said bladder, wherein said pressure sensor is internally integrated within said bladder; and d. a signal processor for measuring the weight of the occupant from said signal for generating a control signal for controlling the safety restraint system responsive to said weight measurement.

18. A system for measuring the weight of an occupant in a vehicle seat and for controlling a safety restraint system responsive thereto, comprising:

a. a bladder mounted beneath the cushion of the seat and supported by the base of the seat, whereby said bladder is constructed from a flexible material;

b. a fluid contained by said bladder;

c. a pressure sensor operably coupled to said bladder for generating a signal responsive to the pressure of said fluid within said bladder, wherein said pressure sensor is isolated from said fluid by the surface of said fluid filled bladder; and d. a signal processor for measuring the weight of the occupant from said signal for generating a control signal for controlling the safety restraint system responsive to said weight measurement.

19. A system for measuring the weight of an occupant in a vehicle seat and for controlling a safety restraint system responsive thereto as recited in claim 18, further comprising a restraint located on the inside of said fluid filled bladder proximate said pressure sensor, whereby said restraint prevents said fluid filled bladder from collapsing proximate said pressure sensor.

* * * * *